United States Patent
Deaton et al.

[19]

[11] Patent Number: 6,048,403
[45] Date of Patent: Apr. 11, 2000

[54] MULTI-LEDGE SUBSTRATE SUPPORT FOR A THERMAL PROCESSING CHAMBER

[75] Inventors: Paul Deaton, San Jose; Meredith J. Williams, Santa Clara, both of Calif.

[73] Assignee: Applied Materials, Inc., Santa Clara, Calif.

[21] Appl. No.: 09/053,286

[22] Filed: Apr. 1, 1998

[51] Int. Cl.[7] ............................... C23C 16/00; C23F 1/02
[52] U.S. Cl. .......................... 118/725; 118/728; 118/729; 118/730; 118/500; 427/248.1; 134/2; 134/3; 134/19; 134/25.4; 134/32; 134/33; 134/104.1; 156/345; 216/58; 216/63
[58] Field of Search ..................... 118/728, 729, 118/730, 725, 500; 427/248.1; 134/2, 3, 19, 25.4, 32, 33, 104.1; 156/345; 216/58, 63

[56] References Cited

U.S. PATENT DOCUMENTS

| | | |
|---|---|---|
| 698,031 | 4/1902 | Leslie . |
| 1,850,684 | 3/1932 | Nathan . |
| 3,436,255 | 4/1969 | Harris et al. ............................ 118/725 |
| 3,622,427 | 11/1971 | Kelly ....................................... 161/42 |
| 4,365,588 | 12/1982 | Jolly ........................................ 118/732 |
| 4,770,630 | 9/1988 | Akimoto et al. ....................... 432/121 |
| 4,978,567 | 12/1990 | Miller ..................................... 428/157 |
| 5,169,684 | 12/1992 | Takagi ................................. 427/248.1 |
| 5,316,472 | 5/1994 | Niino et al. ............................ 432/241 |
| 5,431,561 | 7/1995 | Yamabe et al. ........................ 432/253 |
| 5,474,612 | 12/1995 | Sato et al. .............................. 118/725 |
| 5,482,559 | 1/1996 | Imai et al. .............................. 118/728 |
| 5,556,275 | 9/1996 | Sakata et al. .......................... 432/241 |
| 5,584,936 | 12/1996 | Pickering et al. ...................... 118/728 |
| 5,616,208 | 4/1997 | Lee ......................................... 156/345 |
| 5,637,153 | 6/1997 | Niino et al. ......................... 134/22.11 |
| 5,660,472 | 8/1997 | Peuse et al. ............................ 374/128 |
| 5,671,119 | 9/1997 | Huang et al. .......................... 361/234 |
| 5,746,928 | 5/1998 | Yen et al. ................................ 216/37 |
| 5,871,588 | 2/1999 | Moslehi et al. ........................ 118/730 |

*Primary Examiner*—Jeffrie R Lund
*Attorney, Agent, or Firm*—Fish & Richardson

[57] ABSTRACT

A substrate support, for example an edge ring, includes an upper ledge for supporting a first substrate, such as a semiconductor wafer, during a first process, and a lower ledge contiguous with the upper ledge for supporting a second substrate during a second process for cleaning the substrate support. A method of processing substrates supported by the edge ring in a thermal process chamber is also disclosed.

18 Claims, 6 Drawing Sheets

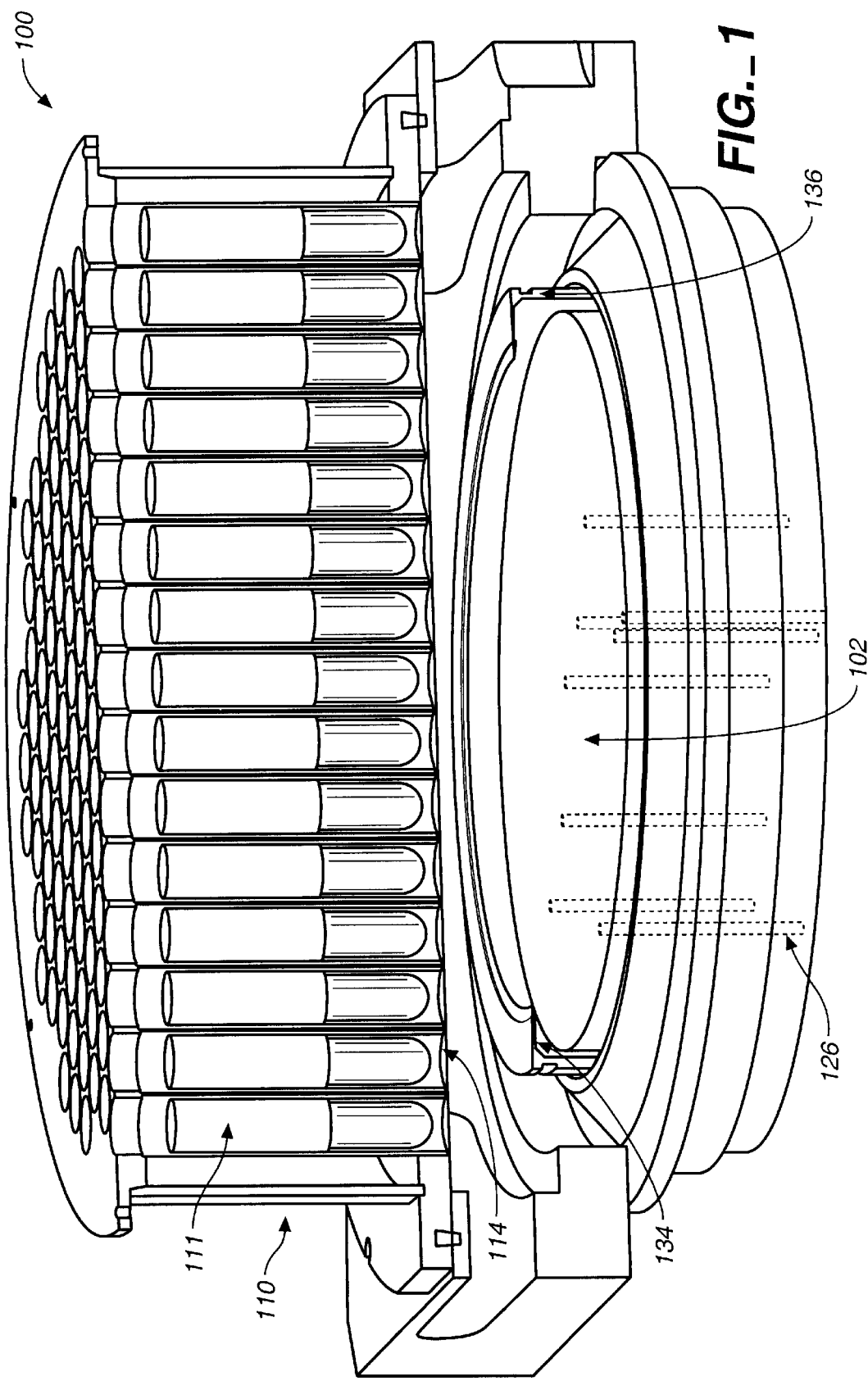

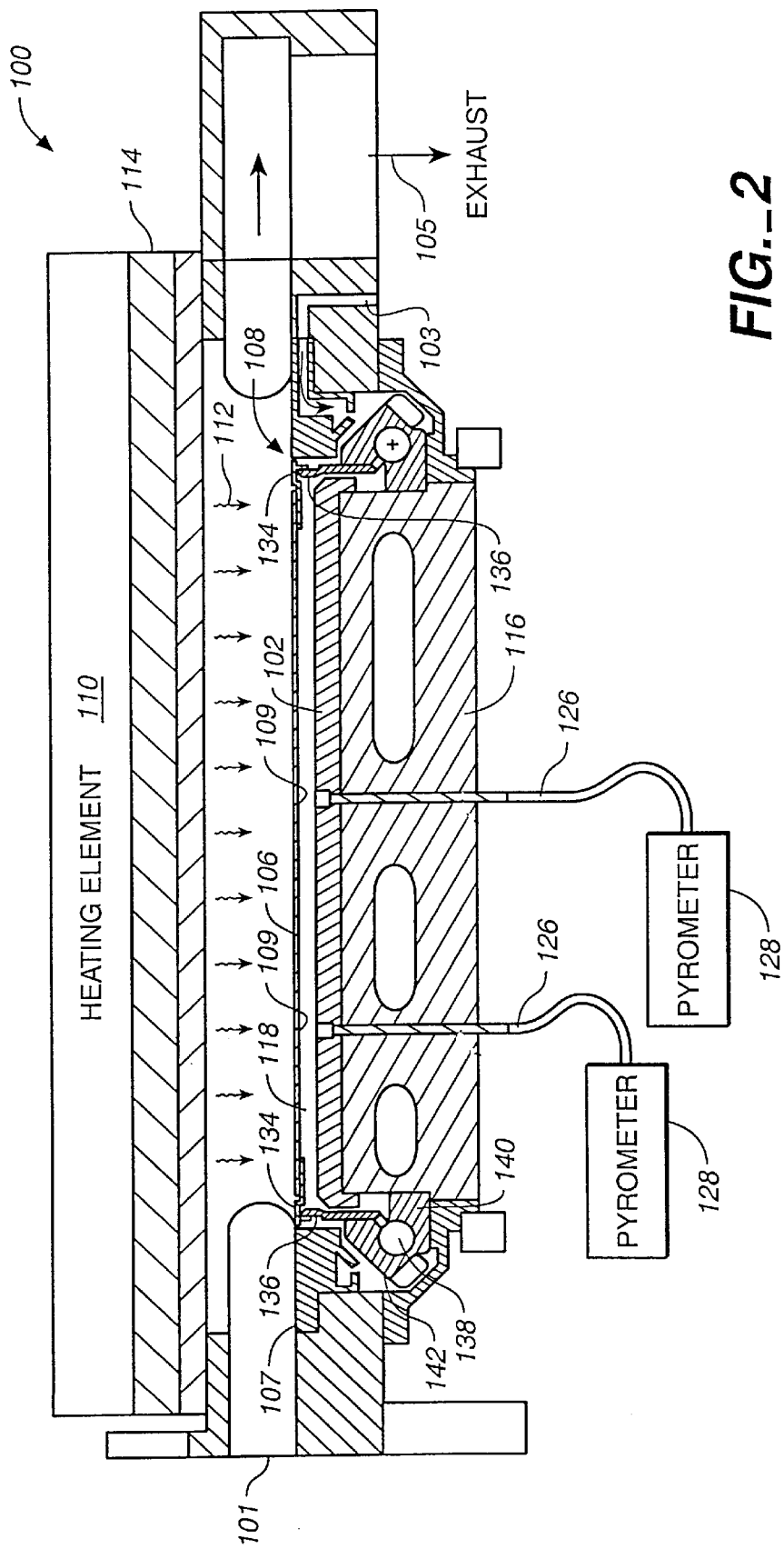
FIG._2

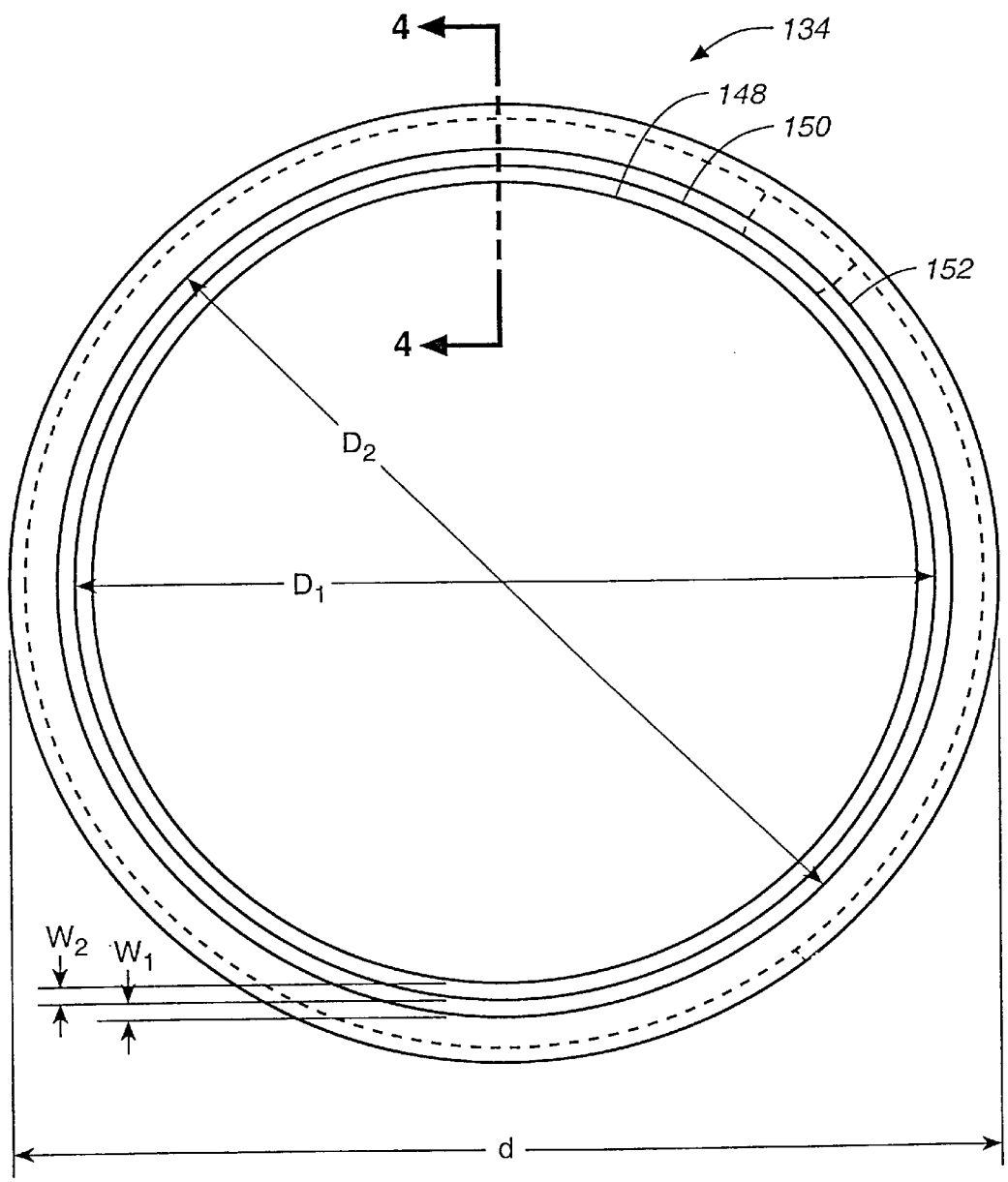
FIG._3

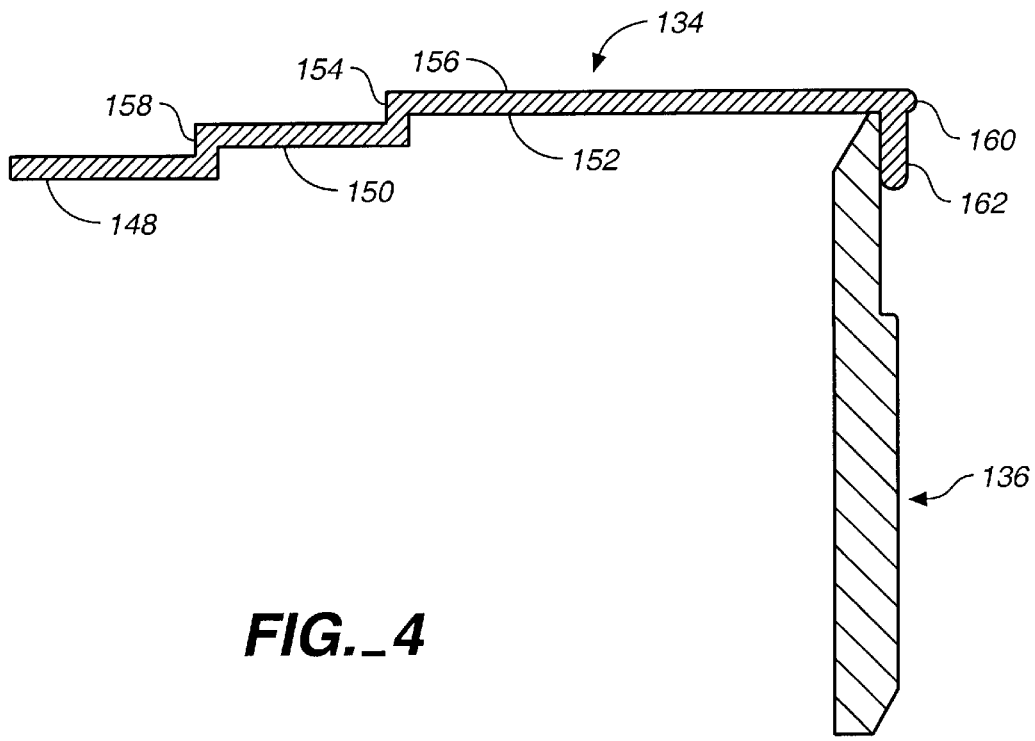
FIG._4
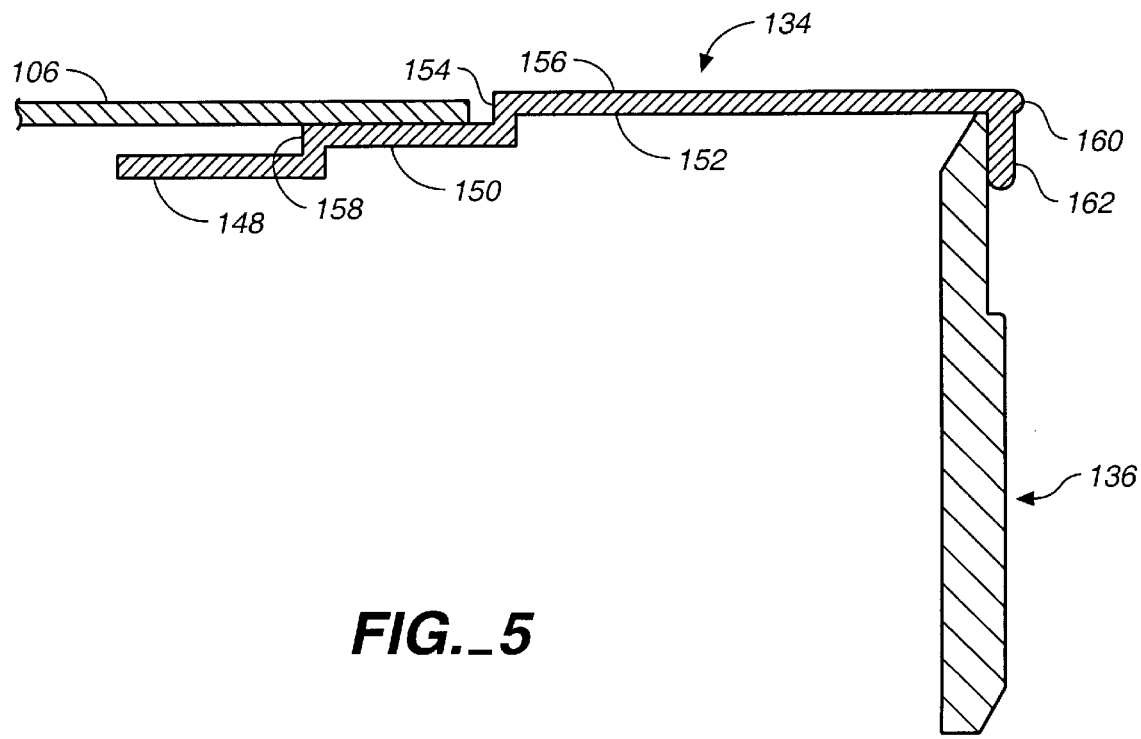
FIG._5

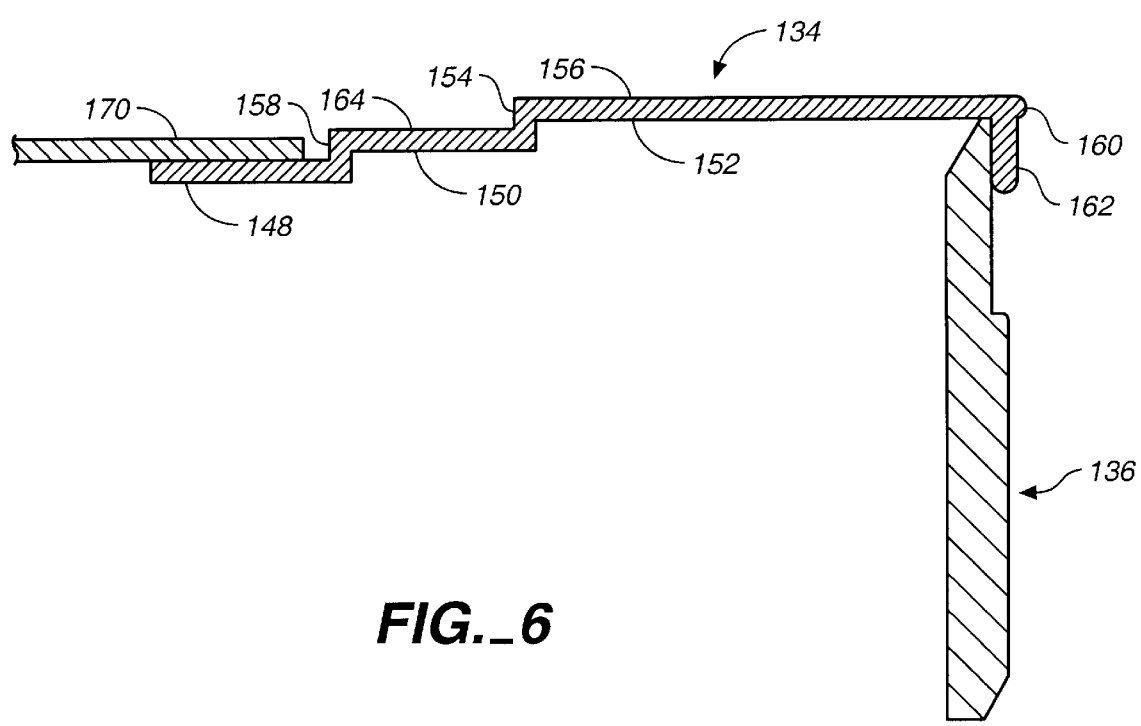
FIG._6

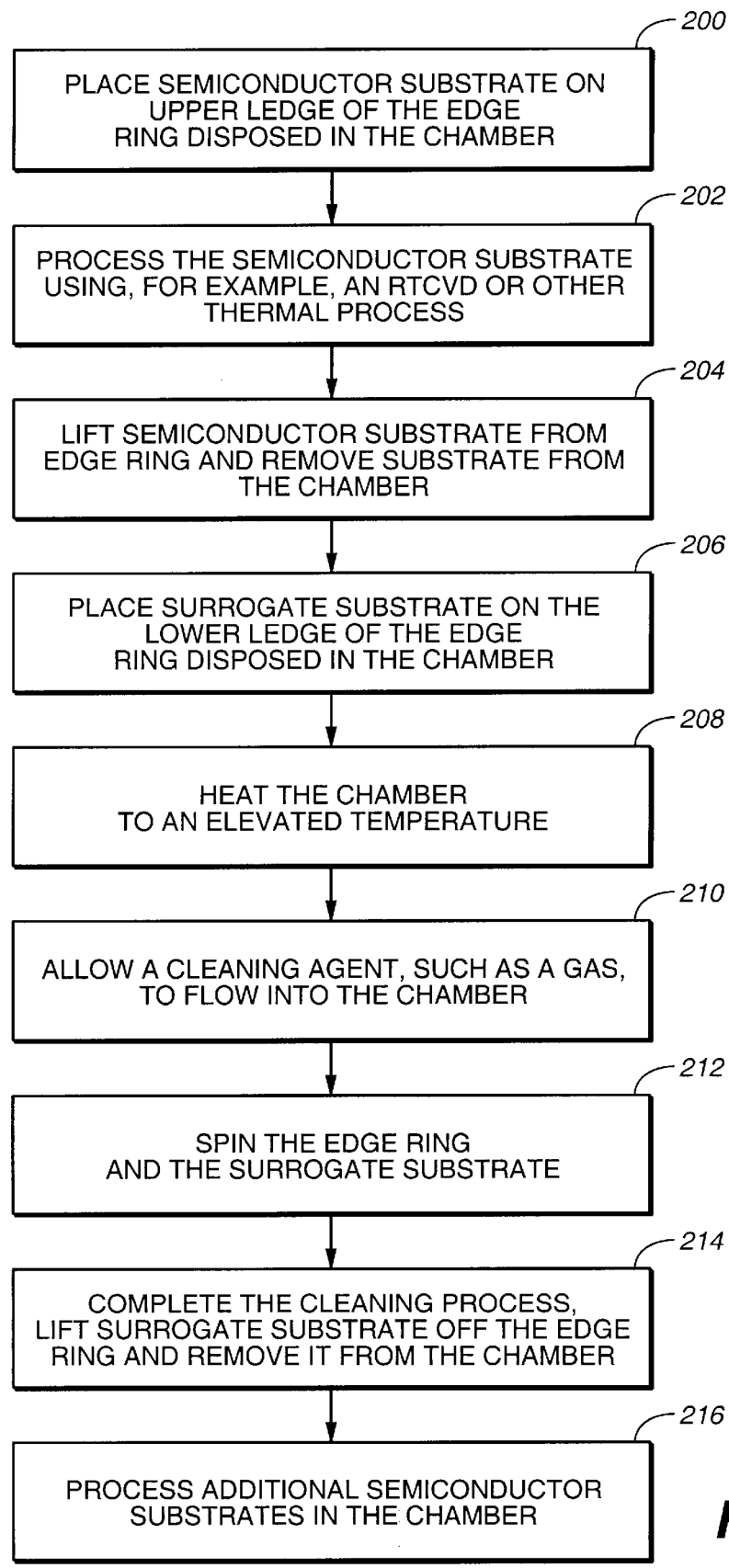
FIG._7

MULTI-LEDGE SUBSTRATE SUPPORT FOR A THERMAL PROCESSING CHAMBER

BACKGROUND

This invention relates to a substrate support for a thermal processing chamber.

In many semiconductor device manufacturing processes, the required high levels of device performance, yield, and process repeatability can only be achieved if the temperature of the substrate (e.g., a semiconductor wafer) is tightly monitored and controlled during processing of the substrate.

Rapid thermal processing (RTP), for example, is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN).

In some semiconductor processing systems, such as susceptorless systems, the substrate is supported around its perimeter with an edge ring. Some fabrication processes, such as RTCVD processes, can lead to the formation of deposits, such as silicon, on the edge ring as well as on the semiconductor substrate. Over time, the deposits accumulate on the edge ring. Moreover, due to variations in the placement of substrates within the edge ring pocket, the accumulated deposits may not be uniform across the surface of the substrate. Such uneven deposits may introduce undesired features on the backside of the substrate and adversely impact subsequent lithography or other processing steps, for example, if the substrates do not rest flat within the pocket of the edge ring. Therefore, the edge ring must be cleaned periodically so that the substrates rest properly on the edge ring and so that thermal interactions between the substrates and the edge ring do not adversely affect operation of the system.

One technique for cleaning the edge ring involves the use of a cleaning gas. To bring the edge ring to a temperature at which the cleaning gas is chemically effective, a surrogate substrate the same size as the semiconductor substrate can be used. During the cleaning process, the surrogate substrate is supported by the edge ring in the same manner as the semiconductor substrate. Such a cleaning procedure, however, can result in the surrogate substrate covering portions of the edge ring which have deposits thereon and which, therefore, should be cleaned prior to using the edge ring to process additional semiconductor substrates.

SUMMARY

In general, in one aspect, a substrate support includes an upper ledge for supporting a first substrate, such as a semiconductor wafer, during a first process and a lower ledge contiguous with the upper ledge for supporting a second substrate during a second process for cleaning the substrate support. The substrate support can be, for example, an edge ring disposed in a thermal processing chamber.

Various implementations include one or more of the following features. The upper ledge and lower ledge can be annular-shaped, with the lower ledge having an outer diameter smaller than an outer diameter of the upper ledge. The upper and lower ledges can have substantially flat upper surfaces. In some implementations, the lower ledge has a radial width approximately the same as a radial width of the upper ledge. For example, the ledges can have respective radial widths of approximately 0.2 inches. In general, however, the dimensions of the edge ring, including the radial widths of the ledges, depend on the particular substrates and processing systems with which the edge ring is to be used.

The substrate support can include an outer portion contiguous with and extending radially outward from the upper ledge. An upstanding structure can connect the outer portion and the upper ledge so that the upstanding structure retains the first substrate on the upper ledge during the first process. Similarly, the substrate support can include another upstanding structure connecting the upper and lower ledges to retain the second substrate on the lower ledge during the cleaning process.

In some implementations, the substrate support includes, for example, silicon carbide or other materials containing silicon.

In another aspect, a method of processing substrates in a thermal process chamber includes providing within the chamber an edge ring having a lower ledge contiguous with an upper ledge, wherein the lower ledge has an outer diameter smaller than an outer diameter of the upper ledge. The method also includes supporting a first substrate on the upper ledge of the edge ring.

In some implementations, a process gas is provided in the chamber. The method can include heating the chamber and spinning the edge ring and the first substrate about a central axis during heating.

The first substrate can be removed from the chamber, and a second substrate can be supported on the lower ledge of the edge ring. A cleaning agent can be provided in the chamber while the second substrate is supported by the lower ledge. The cleaning agent can include a gas, such as HCl, $Cl_2$ or $ClF_3$. In general, the cleaning agent can be selected to remove deposits formed on either ledge depending on the location of a substrate supported by the edge ring. Such deposits may occur, for example, during RTCVD processing.

In addition, the chamber can be heated while the second substrate is supported by the lower ledge to expose the upper ledge to the cleaning gas.

In some implementations, the method also includes spinning the edge ring and the second substrate during heating.

The second substrate can include silicon carbide, graphite, or another material that is substantially impervious to the cleaning agent.

The second substrate can be removed from the chamber, and another substrate can be supported by the cleaned upper ledge of the edge ring. The third substrate, which can be another semiconductor wafer, for example, then can be processed in the chamber with more uniform contact with the edge ring.

Various implementations include one or more of the following advantages. An edge ring or other substrate support with upper and lower ledges can allow surfaces of the edge ring to be cleaned more thoroughly. By providing one ledge to support a semiconductor wafer, for example, during thermal processing, and another ledge to support a surrogate substrate during a cleaning process, surfaces of the edge ring that support and contact the semiconductor wafer can be cleaned more easily and more uniformly to remove deposits that may have formed on the edge ring surface. Such deposits can form, for example, during RTCVD processing of the semiconductor wafers. Removal of the deposits from the edge ring surface can improve the thermal contact between the edge ring and the semiconductor wafer or other substrate. The improved thermal contact can lead to a more uniform temperature across the semiconductor wafer surface because the contact between the edge ring and the entire perimeter of the wafer is more uniform. The improved temperature control can provide higher levels of device performance, yield, and process repeatability. In addition, a more through and uniform removal of the deposits allows the semiconductor substrates to rest flatter on the edge ring, which can lead to better yield and repeatability with respect to subsequent lithographic or other processing steps.

Additional features and advantages will be readily apparent from the following detailed description, drawings and claims.

BRIEF DESCRIPTION OF THE DRAWINGS

FIG. 1 is an elevated partial cross-sectional view of an RTP system according to the present invention.

FIG. 2 is a cross-sectional side view of the RTP system according to the present invention.

FIG. 3 is a plan view of an edge ring according to the present invention.

FIG. 4 is a cross-sectional side view of the edge ring of FIG. 3 along line 4—4.

FIG. 5 is a cross-sectional side view of the edge ring supporting a substrate on an upper ledge.

FIG. 6 is a cross-sectional side view of the edge ring supporting a substrate on a lower ledge.

FIG. 7 is a flow chart illustrating a method of using the edge ring according to the invention.

DETAILED DESCRIPTION

FIGS. 1 and 2 illustrate a rapid thermal processing (RTP) system including a processing chamber 100 for processing a disk-shaped silicon substrate 106. Various features of the RTP system are described in further detail in co-pending U.S. patent application Ser. No. 08/641,477, now U.S. Pat. No. 5,755,511 entitled "Method and Apparatus for Measuring Substrate Temperatures", filed on May 1, 1996, which is incorporated herein by reference.

The substrate 106 is mounted inside the chamber on a substrate support structure 108 and is heated by a heating element 110 located directly above the substrate. The heating element 110, which can include tungsten (W) halogen lamps 111, generates radiation 112 which enters the processing chamber 100 through a water-cooled quartz window assembly 114 disposed above the substrate. The lamps 111 can be arranged in multiple zones which are grouped together in several control groups. A temperature control algorithm is used to control lamps and thereby to control the temperature. Beneath substrate 106 is a reflector 102 which is mounted on a water-cooled, stainless steel base 116. The reflector 102 can be made of aluminum and has a highly reflective surface coating. The underside of substrate 106 and the top of reflector 102 form a reflecting cavity 118 for enhancing the effective emissivity of the substrate, thereby improving the accuracy of temperature measurement.

The temperatures at localized regions 109 of the substrate 106 are measured by a plurality of temperature probes 126 and pyrometers 128. The temperature probes 126, which can include fiber-optic probes, are distributed at varying distances from the center of the substrate 106.

During thermal processing, the support structure 108 is rotated, for example, at about 90 revolutions per minute. Thus, each probe samples the temperature profile of a corresponding annular ring area on the substrate. The support structure which rotates the substrate includes an edge ring 134 which contacts the substrate around the substrate's outer perimeter, thereby leaving all of the underside of the substrate exposed except for a small annular region near the substrate's edge. To minimize the thermal discontinuities that may occur at the edge of the substrate 106 during processing, the edge ring 134 can be made of the same, or similar, material as the substrate, for example, silicon carbide coated with silicon or an oxide of silicon. When the support structure 108 is rotated, the edge ring 134 and substrate 106 spin about a central axis as the chamber is heated.

The edge ring 134 rests on a rotatable tubular quartz cylinder 136 that is coated with silicon to render it opaque in the frequency range of pyrometers 128. The silicon coating on the quartz cylinder acts as a baffle to block out radiation from external sources that might disturb the temperature measurements. The bottom of the quartz cylinder is held by an annular upper bearing race 142 which rests on a plurality of ball bearings 138 that are, in turn, held within a stationary, annular, lower bearing race 140.

During processing, a process gas is introduced into the space between the substrate 106 and the water-cooled quartz window assembly 114 through an inlet port 101. Gases are exhausted through an exhaust port 105 coupled to a vacuum pump (not shown).

An optional purge ring 107 is fitted into the chamber body and surrounds the quartz cylinder 136. The purge ring 107 has an internal annular cavity which opens to a region above the upper bearing race 142. The internal cavity is connected to a regulated purge gas supply through a passageway 103. During process steps that include providing a process gas into the upper portion of the chamber 100, a flow of purge gas enters the chamber through the purge ring 107.

Referring to FIGS. 3–4, the edge ring 134 has an outer portion 152 supported from underneath by the quartz cylinder 136; a central portion 150 forming a substantially flat first, or upper, annular ledge; and an inner portion 148 forming a substantially flat second, or lower, annular ledge.

A 200 mm substrate has a diameter of approximately 8 inches and a thickness of approximately 0.03 inches (0.775 mm). The outer diameter of the upper ledge 150 is slightly larger than the nominal diameter of the semiconductor substrate 106. The transition between the upper ledge 150 and the outer portion 152 forms an inward facing, upstanding surface 154 that keeps the semiconductor substrate 106 centered on the edge ring 134 during processing. The upper ledge 150 thus supports the semiconductor substrate 106, and the upstanding surface 154 and the upper ledge form a pocket for the substrate (FIG. 5). In some implementations, the upstanding surface 154 forms substantially right angles with the upper and lower ledges 150, 148. However, in other implementations, the surface 154 can be inclined between the lower ledge 148 and the upper ledge 150.

The outer portion 152 of the edge ring 134 in the illustrated implementation has a substantially flat upper surface 156 that is at the same elevation as the top of the upstanding surface 154 to allow smooth flow of process gases across the surface. The support structure 108 also is designed to create a light seal between the edge ring 134 and the quartz cylinder 136. The bottom of the edge ring 134, near its outer edge 160, forms an annular-shaped shoulder 162 which has an inside diameter that is slightly larger than the outside diameter of the quartz cylinder 136, so that it fits over the cylinder forming a light seal.

The transition between the lower ledge 148 and the upper ledge 150 forms a second inward facing, upstanding surface 158. The lower ledge 148 supports a surrogate substrate 170 (FIG. 6). The upstanding surface 158 and the lower ledge 150 thus form a lower pocket for the surrogate substrate and keep the surrogate substrate centered in the lower ledge 148 during an edge ring cleaning process. The diameter of the surrogate substrate 170 is smaller than the diameter of the semiconductor substrate 106. Accordingly, the outer diameter of the lower ledge 148 can be made smaller than the outer diameter of the upper ledge 150.

In one exemplary implementation for an 8-inch (200 mm) substrate 106, the edge ring can have an outer diameter (d) of approximately 9.3 inches. The outer diameter $D_1$ of the lower ledge 148 can be approximately 7.6 inches (190 mm). The radial width ($w_1$) of the upper ledge 150 can be approximately 0.2 inches (5 mm) such that the outer diameter $D_2$ of the upper ledge is approximately 8 inches (200 mm). Thus, the outer diameter $D_1$ of the lower ledge is smaller than the outer diameter $D_2$ of the upper ledge.

In general, the dimensions of the upstanding surface 154 and the ledge 150 are designed to be sufficiently high and wide, respectively, to make sure that the substrate 106 does not slip off the ledge 152 when the support structure 108 and substrate spin during substrate processing. The radial width ($w_1$) of the upper ledge 150 also should be selected to ensure that if a substrate 106 is positioned slightly off-center on the ledge 150, a gap will not be formed between the ledge and one side of the substrate. Such a gap could allow light to leak into the cavity 118. Other dimensions may suitable for particular applications.

The radial width ($w_2$) of the lower ledge 148 and the height of the upstanding surface 158 can be approximately the same as the radial width ($w_1$) of the upper ledge 150 and the height of the surface 154, respectively. In general, the dimensions of the upstanding surface 158 and the ledge 148 are designed to be sufficiently high and wide, respectively, to make sure that the surrogate substrate 170 does not slip off the ledge 148 when the support structure 108 and substrate spin during the cleaning process.

The foregoing dimensions are suitable for one implementation of the edge ring 134 in certain processing chambers, such as the RTP Centura™ or the RTP Centura XE™, manufactured by Applied Materials, Inc. Other dimensions may be suitable for wafers of different sizes, for example, a 6-inch (150 mm) or a 12-inch (300 mm) semiconductor wafer, or for wafer processing systems different from the RTP system described above. Thus, for example, the dimensions of an edge ring suitable for use with 300 mm substrates can be scaled appropriately.

The illustrated implementation of FIGS. 3–6 can be formed by grinding a disk of chemical vapor deposited (CVD) silicon carbide with a diamond grinding head. Exterior corners can be fully rounded and interior corners can be rounded to a radius of at least approximately 0.01 inches (0.25 mm) to reduce mechanical stresses in the edge ring 134. The entire edge ring 134 can be coated with approximately 0.004 inches (0.1 mm) of poly-silicon on each side. In various implementations, layers of different or additional materials also can be added to the edge ring.

A method of using the edge ring 134 is described with reference to FIG. 7. With the edge ring 134 disposed in the chamber 100, a semiconductor substrate 106 is placed on the upper ledge 150 of the edge ring for processing (step 200). The semiconductor substrate 106 then can be processed in the chamber 100 as described generally above (step 202). Such processing can include an RTCVD or similar process during which a process gas is provided to the chamber. After processing, the substrate 106 is lifted from the edge ring 134 and removed from the chamber 100 (step 204). One or more semiconductor substrates 106 can be processed in this manner.

At a subsequent time, with the edge ring 134 disposed in the chamber 100, a surrogate substrate 170 is placed on the lower ledge 148 of the edge ring (step 206). The surrogate substrate 170 can be made, for example, of silicon carbide (SiC), graphite, or another material that is substantially impervious to the gases that are used during the cleaning process. With the surrogate substrate 170 supported by the lower ledge 148, the chamber 100 is heated to an elevated temperature, for example, approximately 1100° C. (step 208). A cleaning agent, such as hydrochloric acid (HCl), is allowed to flow into the chamber 100 through the port 101 (step 210), and the support structure 108 is caused to spin so that the edge ring 134 and the surrogate substrate 170 spin about the central axis of the chamber (step 212). As the cleaning or etching agent flows through the chamber 100, the silicon or other deposits that may have formed on the edge ring 134 during semiconductor substrate processing are removed from the edge ring surfaces 156, 154, 164 by chemical reactions with the cleaning or etching agent. The cleaning process can be continued for several minutes. In general, the duration of the etching or other cleaning process will depend on the particular etching agent used, the length of time since the last cleaning, and the chamber temperature, as well as other factors. The resulting gases are removed from the chamber 100 through the exhaust port 105.

In various implementations, other gases, such as chlorine ($Cl_2$) or chlorine tri-fluoride ($ClF_3$), can be used as the etching agent to clean the edge ring and remove undesired materials that formed on the edge ring surfaces during semiconductor processing. In some situations, the etching agent flows into the chamber 100 through dedicated passageways (not shown) rather than through the inlet port 101. Also, a purge gas can flow through the passageway 103 during the cleaning process.

Once the cleaning process is completed, the surrogate substrate 170 is lifted off the lower ledge 148 of the edge ring and removed from the chamber 100 (step 214). Additional semiconductor substrates 106 then can be processed in the chamber 100 as described above (step 216).

Other implementations are within the scope of the following claims.

What is claimed is:

1. A single-wafer RTP reaction chamber in which a reflective cavity is formed between a first substrate placed in the chamber and a reflective surface below the first substrate, wherein the chamber includes an edge ring having an upper ledge for supporting the first substrate during a first process and an upstanding structure connected to the upper ledge to retain the first substrate on the upper ledge during the first process, and a lower ledge contiguous with the upper ledge for supporting a second substrate above the reflective surface during a second process for cleaning the edge ring.

2. The reaction chamber of claim 1 wherein the upper ledge and lower ledge are annular-shaped, and wherein the lower ledge has an outer diameter smaller than an outer diameter of the upper ledge.

3. The reaction chamber of claim 2 wherein the upper ledge comprises a substantially flat upper surface.

4. The reaction chamber of claim 2 wherein the lower ledge comprises a substantially flat upper surface.

5. The reaction chamber of claim 2 wherein the edge ring includes an upstanding structure connecting the upper and lower ledges to retain the second substrate on the lower ledge during the cleaning process.

6. The reaction chamber of claim 2 wherein the edge ring has an outer portion contiguous with and extending radially outward from the upper ledge, and the upstanding structure connecting the outer portion and the upper ledge.

7. The reaction chamber of claim 2 wherein the lower ledge has a radial width approximately the same as a radial width of the upper ledge.

8. The reaction chamber of claim 2 wherein the edge ring comprises silicon.

9. A method of processing substrates in a thermal process chamber, the method comprising:

providing within the chamber an edge ring having a lower ledge contiguous with an upper ledge, wherein the lower ledge has an outer diameter smaller than an outer diameter of the upper ledge;

supporting a first substrate on the upper ledge of the edge ring;

heating the chamber and providing a process gas to the chamber while the first substrate is supported by the upper ledge in the absence of a substrate on the lower ledge;

removing the first substrate from the chamber;

supporting a second substrate on the lower ledge of the edge ring; and providing a cleaning agent in the chamber while the second substrate is supported by the lower ledge.

10. The method of claim 9 further comprising spinning the edge ring about a central axis during the heating.

11. The method of claim 9 further comprising heating the chamber while the second substrate is supported by the lower ledge.

12. The method of claim 11 further comprising spinning the edge ring during heating while the second substrate is supported by the lower ledge.

13. The method of claim 9 wherein the cleaning agent comprises a gas.

14. The method of claim 9 wherein the cleaning agent removes deposits that were formed on the edge ring while the first substrate was supported by the edge ring.

15. The method of claim 9 wherein the second substrate comprises a material that is substantially impervious to the cleaning agent.

16. The method of claim 9 further comprising:

removing the second substrate from the chamber;

supporting a third substrate on the upper ledge of the edge ring; and providing a process gas in the chamber while the third substrate is supported by the edge ring.

17. A method of processing substrates in a thermal process chamber, the method comprising:

providing within the chamber an edge ring having a lower ledge contiguous with an upper ledge, wherein the lower ledge has an outer diameter smaller than an outer diameter of the upper ledge;

supporting a first substrate on the upper ledge of the edge ring;

processing the first substrate while it is supported on the upper ledge in the absence of a substrate on the lower ledge;

removing the first substrate from the chamber;

subsequently supporting a second substrate on the lower ledge of the edge ring;

providing a cleaning agent in the chamber while the second substrate is supported by the lower ledge.

18. The method of claim 17 comprising providing a process gas in the chamber during processing of the first substrate.

* * * * *